United States Patent
Tanaka

(10) Patent No.: US 9,929,259 B2
(45) Date of Patent: Mar. 27, 2018

(54) SEMICONDUCTOR DEVICE AND MANUFACTURING METHOD FOR SEMICONDUCTOR DEVICE

(71) Applicant: LAPIS SEMICONDUCTOR CO., LTD., Kanagawa (JP)

(72) Inventor: Hiroyuki Tanaka, Kanagawa (JP)

(73) Assignee: LAPIS SEMICONDUCTOR CO., LTD., Yokohama (JP)

(*) Notice: Subject to any disclaimer, the term of this patent is extended or adjusted under 35 U.S.C. 154(b) by 0 days.

(21) Appl. No.: 15/447,692

(22) Filed: Mar. 2, 2017

(65) Prior Publication Data

US 2017/0179266 A1    Jun. 22, 2017

Related U.S. Application Data

(63) Continuation of application No. 15/081,176, filed on Mar. 25, 2016, now Pat. No. 9,620,629.

(30) Foreign Application Priority Data

Mar. 31, 2015    (JP) ................................. 2015-071476

(51) Int. Cl.
| | | |
|---|---|---|
| *H01L 29/735* | (2006.01) | |
| *H01L 29/739* | (2006.01) | |
| *H01L 29/10* | (2006.01) | |
| *H01L 29/06* | (2006.01) | |
| *H01L 29/66* | (2006.01) | |

(Continued)

(52) U.S. Cl.
CPC ...... *H01L 29/7394* (2013.01); *H01L 29/0649* (2013.01); *H01L 29/0657* (2013.01); *H01L 29/0808* (2013.01); *H01L 29/0821* (2013.01); *H01L 29/1008* (2013.01); *H01L 29/1095* (2013.01); *H01L 29/66325* (2013.01); *H01L 29/735* (2013.01); *H01L 29/7322* (2013.01); *H01L 29/7398* (2013.01)

(58) Field of Classification Search
CPC ........... H01L 21/02109; H01L 27/0711; H01L 29/7398
See application file for complete search history.

(56) References Cited

U.S. PATENT DOCUMENTS 5,559,348 A * 9/1996 Watabe ............... H01L 29/0619
                                                          257/141
2015/0187678 A1* 7/2015 Park ..................... H01L 23/367
                                                          257/712

FOREIGN PATENT DOCUMENTS

JP        2010-186878 A       8/2010

* cited by examiner

*Primary Examiner* — Cheung Lee
(74) *Attorney, Agent, or Firm* — Volentine & Whitt, PLLC

(57) ABSTRACT

A semiconductor device including: a P-type base region provided; an N-type emitter region provided inside the P-type base region; a P-type collector region that is provided on the surface layer portion of the N-type semiconductor layer and is separated from the P-type base region; a gate insulating film that is provided on the surface of the N-type semiconductor layer, and that contacts the P-type base region and the N-type emitter region; a gate electrode on the gate insulating film; a pillar shaped structure provided inside the N-type semiconductor layer between the P-type base region and the P-type collector region, wherein one end of the pillar shaped structure is connected to an N-type semiconductor that extends to the surface layer portion of the N-type semiconductor layer, and the pillar shaped structure includes an insulator extending in a depth direction of the N-type semiconductor layer.

6 Claims, 15 Drawing Sheets

(51) Int. Cl.
*H01L 29/08* (2006.01)
*H01L 29/732* (2006.01)

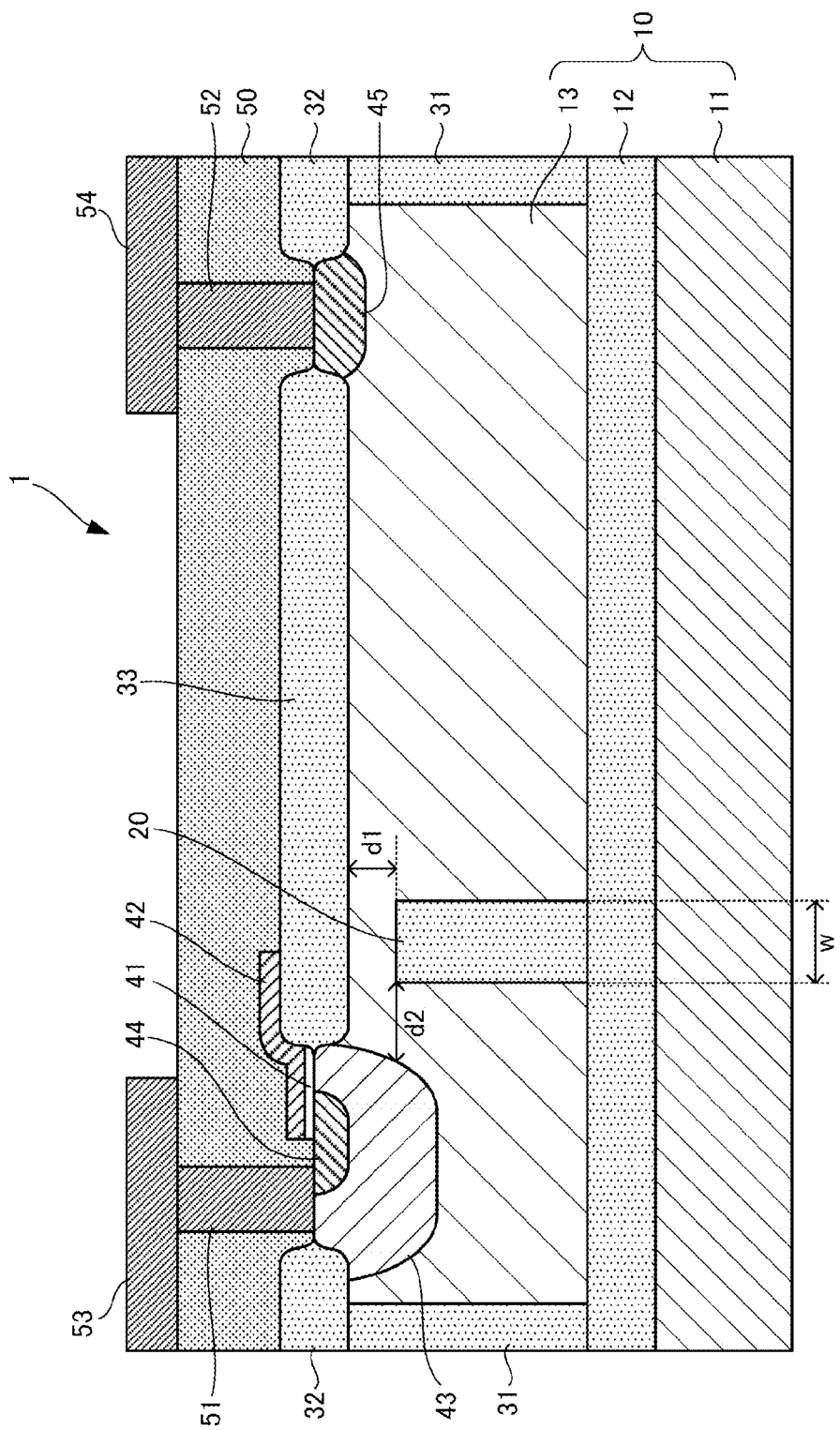

ELECTRON DENSITY DISTRIBUTION

HOLE DENSITY DISTRIBUTION

COMPARATIVE EXAMPLE

ELECTRON DENSITY DISTRIBUTION

COMPARATIVE EXAMPLE

HOLE DENSITY DISTRIBUTION

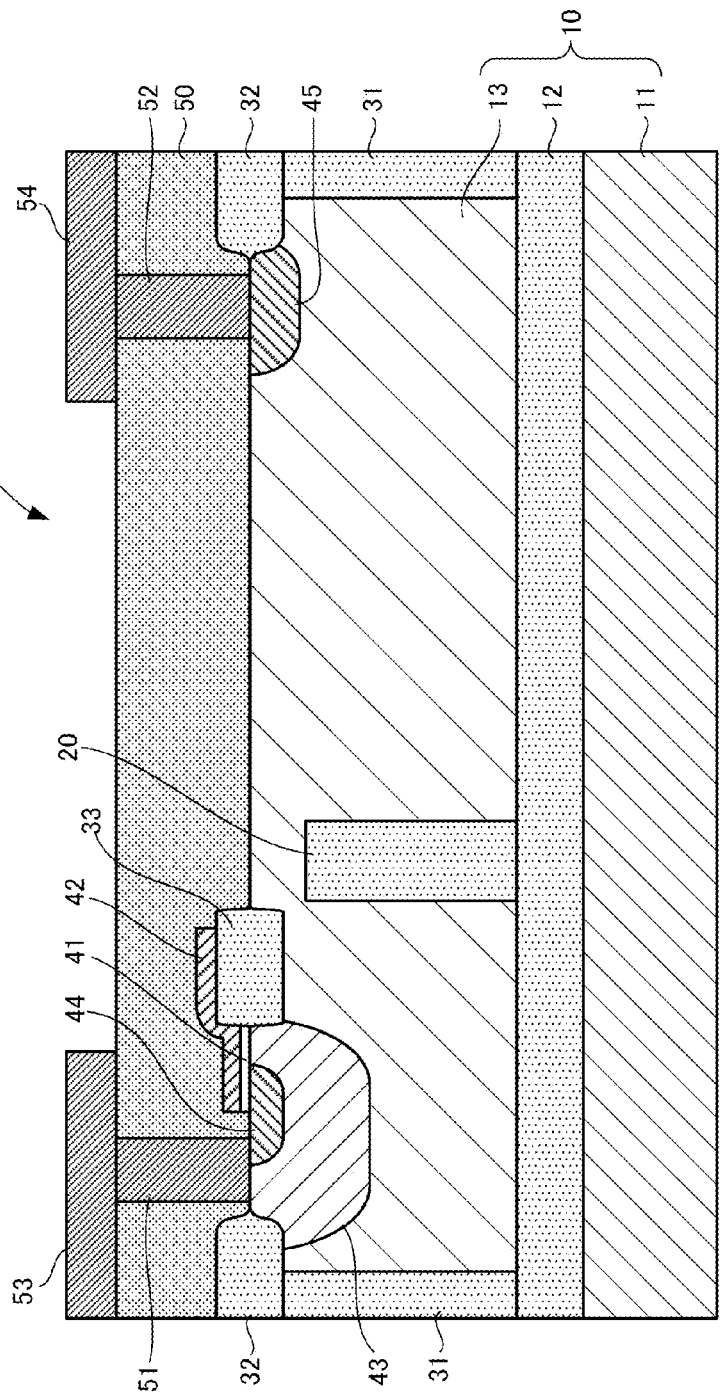

COMPARATIVE EXAMPLE

SEMICONDUCTOR DEVICE AND MANUFACTURING METHOD FOR SEMICONDUCTOR DEVICE

CROSS-REFERENCE TO RELATED APPLICATION

This application is a continuation application of application Ser. No. 15/081,176, filed on Mar. 25, 2016, now U.S. Pat. No. 9,620,629 issued on Apr. 11, 2017. This application is based on and claims priority under 35 USC 119 from Japanese Patent Application No. 2015-071476, filed on Mar. 31, 2015, the disclosure of which is incorporated by reference herein.

BACKGROUND

Technical Field

The present invention relates to a semiconductor device and a manufacturing method for a semiconductor device.

Related Art

An insulated gate bipolar transistor (IGBT) is a type of power device whose importance is recently steadily increasing with the demand to build a low energy society. In particular, lateral IGBTs can be incorporated into ICs and are therefore expected to have diverse applications.

The following are known as examples of technology for improving the withstand voltage of an IGBT. Japanese Patent Application Laid-Open (JP-A) No. 2010-186878 describes forming a trench in a wafer surface between an n+ emitter region and a p+ collector region, embedding a trench-embedded insulating film in the trench region so as to bend a drift region that supports the withstand voltage, and effectively elongating the drift length.

There is a tradeoff relationship between output characteristics and withstand voltage characteristics in IGBTs. Namely, when the saturation voltage between the collector and emitter is lowered and the loss is decreased, the withstand voltage between the collector and emitter is reduced. However, when the withstand voltage between the collector and emitter is raised and the margin to destruction by overvoltage is increased, the saturation voltage between the collector and emitter is increased. This tradeoff relationship has meant that the overall performance of conventional lateral IGBTs cannot be considered sufficiently high.

SUMMARY

An object of the present invention is to provide a semiconductor device, and a manufacturing method for the same, capable of improving output characteristics over those of conventional lateral IGBTs, without a loss of withstand voltage characteristics.

A first aspect of the present invention provides a semiconductor device including:

a P-type base region provided on a surface layer portion of an N-type semiconductor layer;

an N-type emitter region provided inside the P-type base region;

a P-type collector region that is provided on the surface layer portion of the N-type semiconductor layer separately from the P-type base region;

a gate insulating film that is provided on the surface of the N-type semiconductor layer, and that contacts the P-type base region and the N-type emitter region;

a gate electrode provided on the gate insulating film;

a pillar shaped structure provided inside the N-type semiconductor layer between the P-type base region and the P-type collector region, one end of the pillar shaped structure being connected to an N-type semiconductor that extends to the surface layer portion of the N-type semiconductor layer, and the pillar shaped structure comprising an insulator extending in a depth direction of the N-type semiconductor layer.

A second aspect of the present invention provides a method of manufacturing a semiconductor device, the method including:

forming a trench that extends from a surface of an N-type semiconductor layer in a depth direction of the N-type semiconductor film;

embedding an insulator inside the trench and forming a pillar shaped structure;

burying an upper portion of the pillar shaped structure in the trench with an N-type semiconductor;

forming a gate insulating film on the surface of the N-type semiconductor layer;

forming a gate electrode on the gate insulating film;

forming a P-type base region on a surface layer portion of the N-type semiconductor film so as to contact the gate insulating film;

forming an N-type emitter region inside the P-type base region so as to contact the gate insulating film; and forming a P-type collector region on the surface layer portion of the N-type semiconductor layer such that the pillar shaped structure is interposed between the P-type collector region and the P-type base region.

The present invention obtains the advantageous effect of enabling output characteristics to be improved over conventional lateral IGBTs, without a loss of withstand voltage characteristics.

BRIEF DESCRIPTION OF THE DRAWINGS

Exemplary embodiments of the present invention will be described in detail based on the following figures, wherein:

FIG. 1 is a cross-section illustrating a configuration of a semiconductor device according to an exemplary embodiment of the present invention;

FIG. 9 is a cross-section illustrating a configuration of a semiconductor device according to another exemplary embodiment of the present invention.

DETAILED DESCRIPTION

Figure 2A:
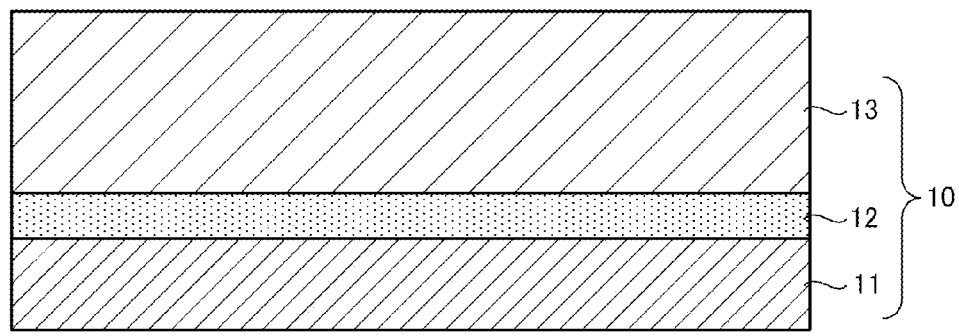
FIG. 2A to 2G are diagrams illustrating a manufacturing method for a semiconductor device according to an exemplary embodiment of the present invention.

Explanation follows regarding an example of an exemplary embodiment, with reference to the drawings. Note that configuration elements and portions that are identical or equivalent are allocated the same reference numerals in each of the drawings.

First Exemplary Embodiment

FIG. 1 is a cross-section illustrating a configuration of a semiconductor device 1 according to an exemplary embodiment of the present invention. The semiconductor device 1 is configured including a silicon on insulator (SOI) substrate 10 configured by stacking a substrate layer 11, an insulating layer 12, and an N-type semiconductor layer 13.

The substrate layer 11 is configured by a semiconductor material such as silicon. The insulating layer 12 is configured by an insulator such as $SiO_2$ having a thickness of approximately 4 μm. The N-type semiconductor layer 13 is configured by, for example, N-type silicon having a thickness of approximately 20 μm.

The semiconductor device 1 configures a so-called lateral IGBT including a P-type base region 43, an N-type emitter region 44, and a P-type collector region 45, respectively provided on a surface layer portion of the N-type semiconductor layer 13. The semiconductor device 1 is electrically isolated from other adjacent semiconductor devices by an element isolation region 31 formed from an insulator such as $SiO_2$, a field oxide film 32, and the insulating layer 12 of the SOI substrate 10.

The P-type base region 43 and the P-type collector region 45 are separated from each other by a field oxide film 33 provided on the surface layer portion of the N-type semiconductor layer 13. Namely, the field oxide film 33 extends between the P-type base region 43 and the P-type collector region 45 that are provided separated from each other, the P-type base region 43 is provided adjacent to the field oxide film 33 at one end side of the field oxide film 33, and the P-type collector region 45 is provided adjacent to the field oxide film 33 at the other end side of the field oxide film 33. The N-type emitter region 44 is provided at a position that is inside the P-type base region 43, and that is separated from the field oxide film 33. Note that the field oxide film 33 is an example of an insulating region of the present invention.

A gate insulating film 41 is, for example, formed from an insulator such as $SiO_2$ having a thickness of approximately 0.1 μm, is adjacent to the field oxide film 33, and is provided on the surface of the N-type semiconductor layer 13 so as to straddle an interface between the P-type base region 43 and the N-type emitter region 44. Namely, the gate insulating film 41 is in contact with both the P-type base region 43 and the N-type emitter region 44.

A gate electrode 42 is, for example, formed from phosphorous-containing polycrystalline silicon or the like, and is provided so as to cover all of the gate insulating film 41 and a portion of the field oxide film 33.

An intermediate insulating film 50 is formed from an insulator such as $SiO_2$, and covers the gate electrode 42, the P-type base region 43, the N-type emitter region 44, and the P-type collector region 45. A contact 51 is formed from an electrical conductor such as tungsten, passes through the intermediate insulating film 50, and is connected to both the P-type base region 43 and the N-type emitter region 44. A contact 52 is formed from an electrical conductor such as tungsten, and passes through the intermediate insulating film 50 to connect to the P-type collector region 45. Wirings 53 and 54, formed from an electrical conductor such as aluminum, are provided to the surface of the intermediate insulating film 50, and are connected to the contacts 51 and 52, respectively.

Between the P-type base region 43 and the P-type collector region 45 inside the N-type semiconductor layer 13, the semiconductor device 1 includes an insulator pillar 20 that has a column shaped structure and extends in the depth direction of the N-type semiconductor layer 13. The insulator pillar 20 is configured including an insulator such as $SiO_2$. One end of the insulator pillar 20 is connected to an N-type semiconductor that extends to the surface layer portion of the N-type semiconductor layer 13, and the other end of the insulator pillar 20 is connected to the insulating layer 12. The field oxide film 33 extends at the upper side of the insulator pillar 20, and the insulator pillar 20 is separated from the field oxide film 33 with the N-type semiconductor between the insulator pillar 20 and field oxide film 33. The insulator pillar 20 forms a slit in the surface layer portion of the N-type semiconductor layer 13, and operates so as to narrow the migration pathway of carriers. As will be explained below, the insulator pillar 20 restricts flow of carriers injected into the N-type semiconductor layer 13 from the N-type emitter region 44 and the P-type collector region 45.

In the present exemplary embodiment, the insulator pillar 20 is disposed so as to be positioned closer to the P-type base region 43 in the length direction of the gate, this being the direction in which the P-type base region 43 and the P-type collector region 45 are placed in a row. Namely, the distance between the insulator pillar 20 and the P-type base region 43 is shorter than the distance between the insulator pillar 20 and the P-type collector region 45. Moreover, a leading end of the insulator pillar 20 is positioned higher than a bottom portion of the P-type base region 43. Note that the insulator pillar 20 is an example of a pillar shaped structure of the present invention.

Explanation follows regarding a manufacturing method for the semiconductor device 1. FIG. 2A to FIG. 2G are cross-sections illustrating the manufacturing method for the semiconductor device 1.

First, the SOI substrate 10 including the insulating layer 12 and the N-type semiconductor layer 13 is prepared (FIG. 2A). The N-type semiconductor layer 13 is, for example, configured by silicon that contains phosphorous as an impurity at approximately $3 \times 10^{14}$ cm$^{-3}$, and that has a thickness of approximately 20 µm.

Figure 2B:
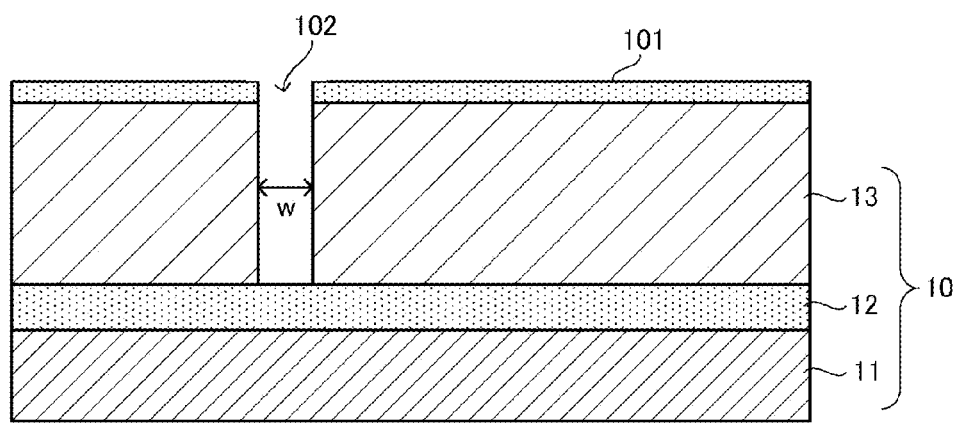

Next, a silicon oxide film 101 having a thickness of approximately 0.1 µm is formed on the surface of the N-type semiconductor layer 13 using a known thermal oxidation method, and a trench 102, reaching down to the insulating layer 12 of the SOI substrate 10, is formed at the formation position of the insulator pillar 20 using a known photolithographic technique and etching technique (FIG. 2B). The width of the trench 102 corresponds to the width w of the insulator pillar 20 in the length direction of the gate, and, for example, may be approximately 5 µm.

Figure 2C:
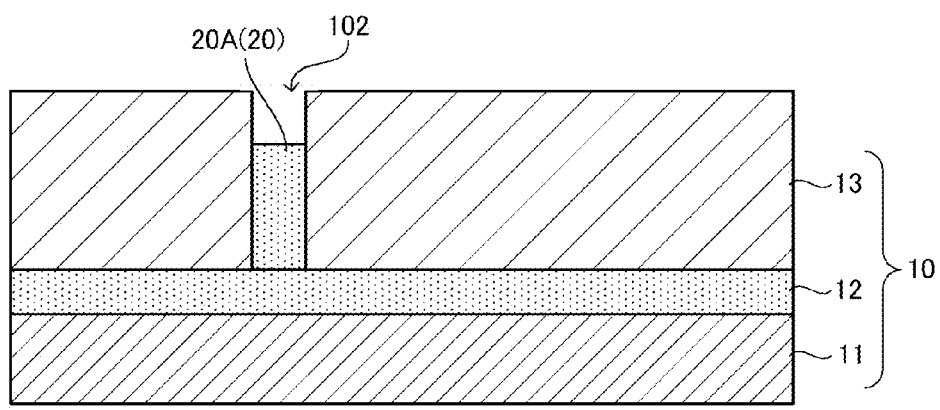

Next, an inner wall of the trench 102 is covered with a silicon oxide film using a known thermal oxidation method, and then an insulator 20A, such as SiO$_2$, is embedded inside the trench 102 using a known chemical vapor deposition (CVD) method. Subsequently, the silicon oxide film 101 formed on the surface of the N-type semiconductor layer 13 is removed, and an approximately 1.5 µm upper portion of the insulator 20A embedded inside the trench 102 is also removed, using a known etch-back method. The insulator pillar 20 is thereby formed connected to the insulating layer 12 of the SOI substrate 10 (FIG. 2C). As long as at least the interface between the insulator pillar 20 and the N-type semiconductor layer 13 is an insulator, an electrical conductor or a semiconductor may be embedded in the remaining portion inside the trench 102 after the inner wall of the trench 102 has been covered by an insulator. Moreover, processing to form an insulator inside the trench 102 may be omitted. Namely, the insulator pillar 20 may be configured by an empty space.

Figure 2D:
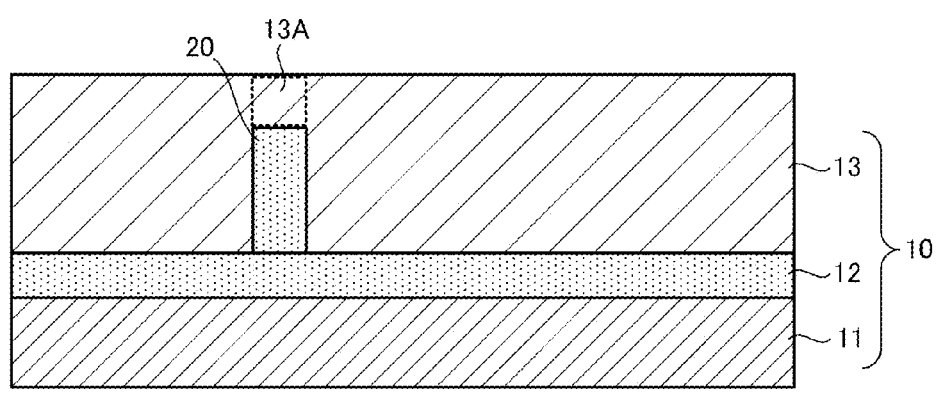

Next, silicon crystals that contain phosphorous at approximately $3 \times 10^{14}$ cm$^{-3}$, this being similar to the concentration of the impurity in the N-type semiconductor layer 13, are caused to grow using a known epitaxial method. In an upper portion of the insulator pillar 20, the silicon crystals grow in a lateral direction from an exposed side wall of the trench 102, and the upper portion of the insulator pillar 20 inside the trench 102 is closed off by N-type silicon 13A that contains phosphorous at a concentration similar to that of the N-type semiconductor layer 13. Moreover, silicon crystals also grow on the surface of the N-type semiconductor layer 13. Subsequently, planarization processing is performed to match the initial surface of the N-type semiconductor layer 13 using a known chemical mechanical polishing (CMP) method (FIG. 2D).

Figure 2E:
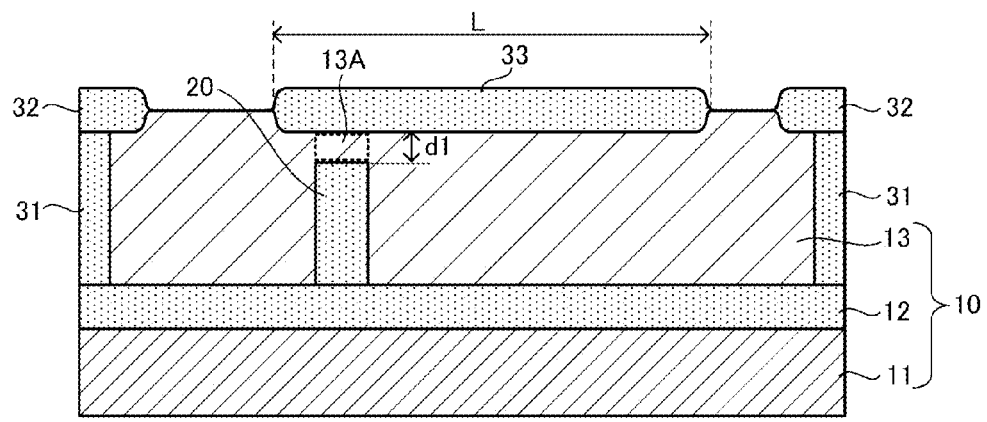

Next, a trench, reaching down to the insulating layer 12, is formed at the formation position of the element isolation region 31 of the N-type semiconductor layer 13, and the element isolation region 31 is formed with an insulator, such as SiO$_2$, embedded therein by using a thermal oxidation method and a CVD method on the trench. Subsequently, the field oxide film 32 and the field oxide film 33, formed from an insulator such as SiO$_2$ having a thickness of approximately 0.8 µm, are formed on the surface of the N-type semiconductor layer 13 using a known local oxidation of silicon (LOCOS) method (FIG. 2E). The field oxide film 33 is provided so as to extend above the insulator pillar 20. In the foregoing processes, N-type silicon 13A formed on the upper portion of the insulator pillar 20 is disposed between the field oxide film 33 and the insulator pillar 20. A distance d1 between the field oxide film 33 and the insulator pillar 20 may be, for example, approximately 1.2 µm. Moreover, the length L of the field oxide film 33 in the gate length direction may be, for example, approximately 60 µm.

Figure 2F:
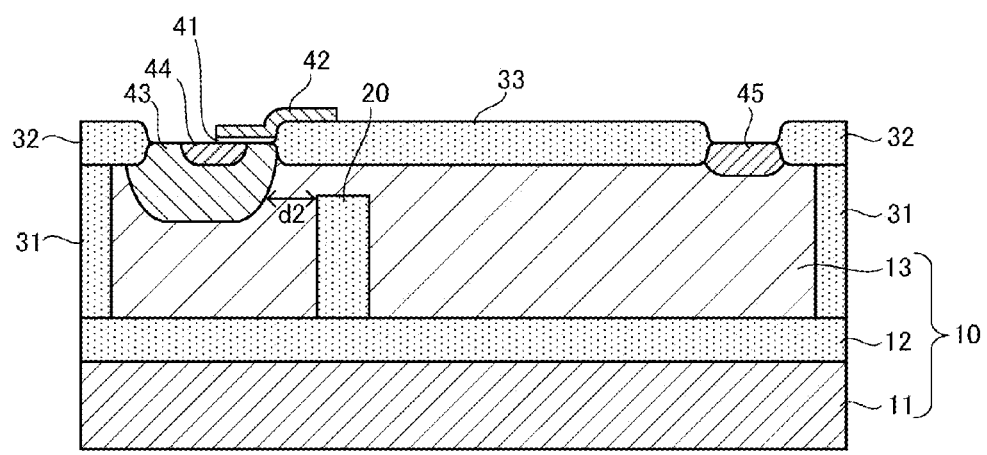
Figure 2G:
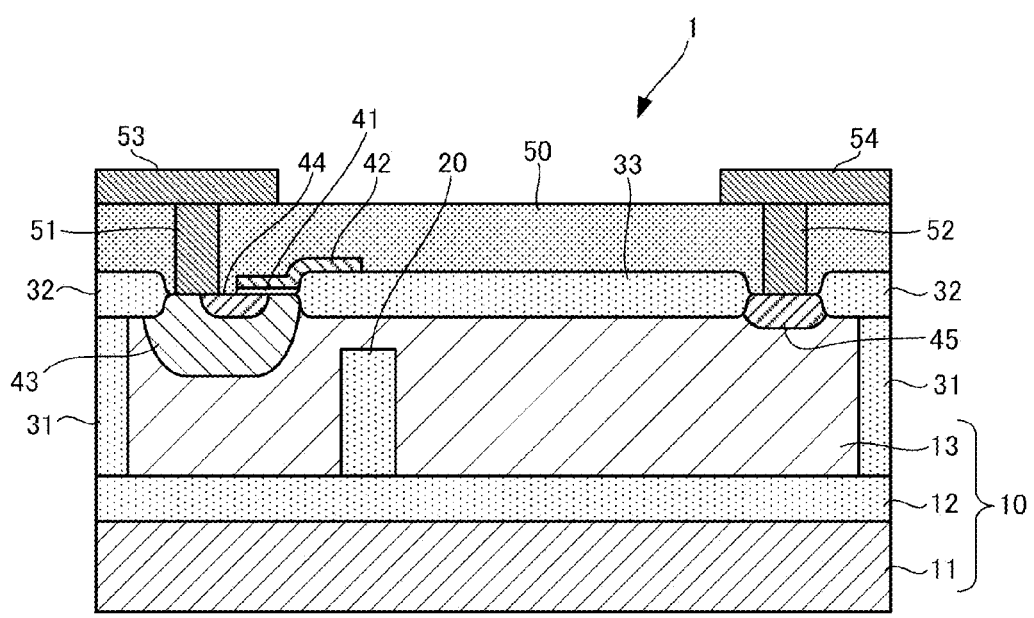

Next, the gate insulating film 41, formed from an insulator such as SiO$_2$ having a thickness of approximately 0.1 µm, is formed using a known thermal oxidation method so as to be adjacent to the field oxide film 33 at the one end side of the field oxide film 33 at the surface of the N-type semiconductor layer 13. Then, the gate electrode 42, formed from polycrystalline silicon that contains phosphorous or the like, is formed using a known CVD method. The gate electrode 42 is formed covering all of the gate insulating film 41 and a portion of the field oxide film 33. Next, the P-type base region 43, the N-type emitter region 44, and the P-type collector region 45 are formed on the surface layer portion of the N-type semiconductor layer 13 using a known ion implantation method and subsequent heat treatment (FIG. 2F). The P-type base region 43 and the P-type collector region 45 each include, for example, boron as an impurity, and the N-type emitter region 44 includes arsenic as an impurity. The P-type base region 43 is formed at one end side of the field oxide film 33, on which the gate electrode 42 is formed, of the surface layer portion of the N-type semiconductor layer 13. The N-type emitter region 44 is formed inside the P-type base region 43 at a position separated from the field oxide film 33. The P-type collector region 45 is formed at the other end side of the field oxide film 33, on a surface layer portion of the N-type semiconductor layer 13. A distance d2 between the P-type base region 43 and the insulator pillar 20 may be, for example, 0.15 µm.

Next, the intermediate insulating film 50, formed from an insulator such as SiO$_2$, is formed so as to cover all of the N-type semiconductor layer 13 using a known CVD method. Next, trenches (not illustrated in the drawings) are formed passing through the intermediate insulating film 50 and reaching down to the surface of the N-type semiconductor layer 13. Next, after forming a barrier metal, such as titanium nitride, on inner walls of the trenches described above, an electrical conductor such as tungsten is embedded inside the trenches so as to form the contacts 51 and 52. The contact 51 is connected to both the P-type base region 43 and the N-type emitter region 44, and the contact 52 is connected to the P-type collector region 45. Next, a wiring material such as aluminum is formed on the surface of the intermediate insulating film 50 using a known sputtering method. Subsequently, the wirings 53 and 54 are formed connected to the contacts 51 and 52, respectively, by patterning the wiring material using a known photolithographic technique and etching technique.

The substrate layer 11, the P-type base region 43, and the N-type emitter region 44 of the semiconductor device 1 have a potential of zero, a channel is formed in the silicon surface directly below the gate insulating film 41 by applying a standard potential (for example, 15V) equal to or greater than a threshold value voltage to the gate electrode 42 in a state in which the standard potential has been applied to the P-type collector region 45, and current flows from the P-type collector region 45 toward the N-type emitter region 44. The voltage between the collector and emitter in a saturated state is referred to as the collector/emitter saturation voltage Vce(sat). The lower the collector/emitter saturation voltage Vce(sat) the smaller the loss, and this is considered excellent performance.

When the gate electrode 42 has a potential of zero similarly to the other electrodes, a channel is not formed even when a standard potential is applied to the P-type collector region 45, and there is virtually no flow of current. However, even in this state, if the potential of the P-type collector region 45 is greatly increased, current flows abruptly due to breakdown phenomena, and the semiconductor device 1 is eventually destroyed. The time at which a steady current is reached after this abrupt increase in current is referred to as the collector/emitter withstand voltage (BVces). The higher the withstand voltage BVces, the higher the voltage at which application can be made, and this is desirable since the margin to reaching destruction can be increased for a given application.

There is generally a tradeoff relationship between the collector/emitter saturation voltage Vce(sat) and the withstand voltage BVces. For example, although the collector/emitter saturation voltage Vce(sat) can be lowered by increasing the concentration of impurities in the N-type semiconductor layer 13, this lowers the withstand voltage BVces.

Figure 10:
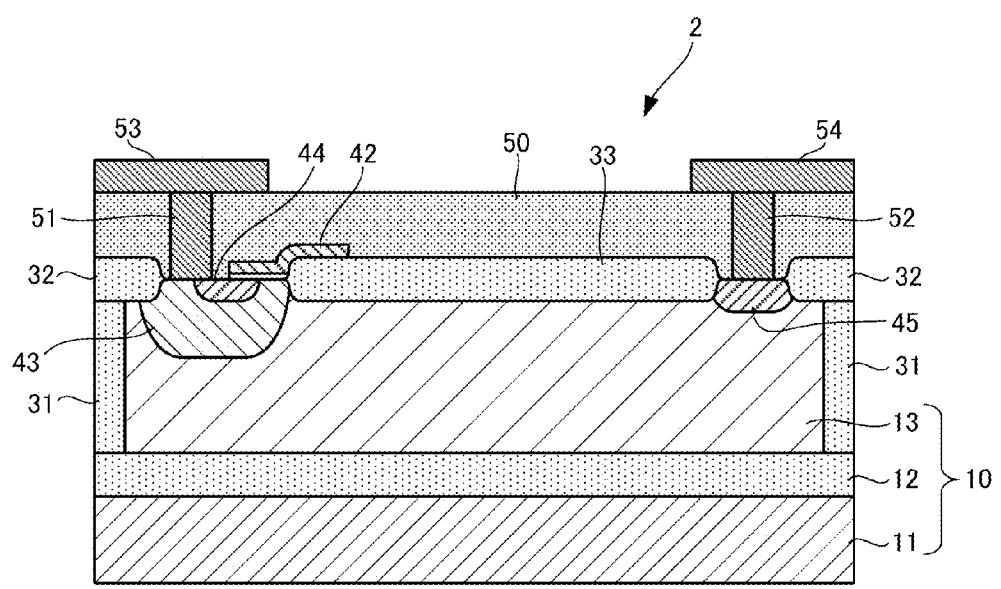
FIG. 10 is a cross-section illustrating a configuration of a semiconductor device according to a comparative example.

A comparison of characteristics of the semiconductor device 1 according to the exemplary embodiment of the present invention against a semiconductor device 2 according to a comparative example illustrated in FIG. 10 was performed by simulation using technology CAD (TCAD). Explanation follows regarding the results thereof. As illustrated in FIG. 10, the semiconductor device 2 according to the comparative example differs from the semiconductor device 1 according to the exemplary embodiment of the present invention in that the insulator pillar 20 is not included. The dimensions of other structures and their respective portions are the same as those in the semiconductor device 1 according to the exemplary embodiment of the present invention. Each simulation was performed with the depth of the semiconductor devices 1 and 2 set to 1 μm.

Figure 3A:
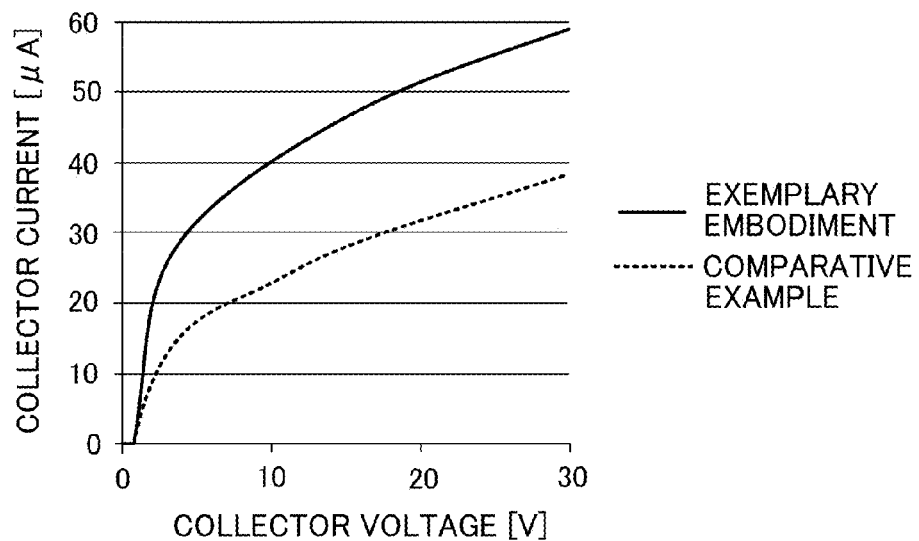
FIG. 3A is a graph illustrating a result of simulating output characteristics of a semiconductor device according to the exemplary embodiment of the present invention and a semiconductor device according to a comparative example.

FIG. 3A is a graph illustrating a relationship between collector voltage and collector current, namely, output characteristics, when the gate voltage has been set to 15V. The solid line in FIG. 3A corresponds to the semiconductor device 1 according to the exemplary embodiment of the present invention, and the dotted line corresponds to the semiconductor device 2 according to the comparative example. When collector current of 10 μA flowed, the collector/emitter saturation voltage Vce(sat) was 1.3V for the semiconductor device 1 according to the exemplary embodiment of the present invention, versus 2.2V for the semiconductor device 2 according to the comparative example.

Moreover, when the collector voltage was 30V, the collector current was 59 μA for the semiconductor device 1 according to the exemplary embodiment of the present invention, versus 38 μA for the semiconductor device 2 according to the comparative example.

Figure 3B:
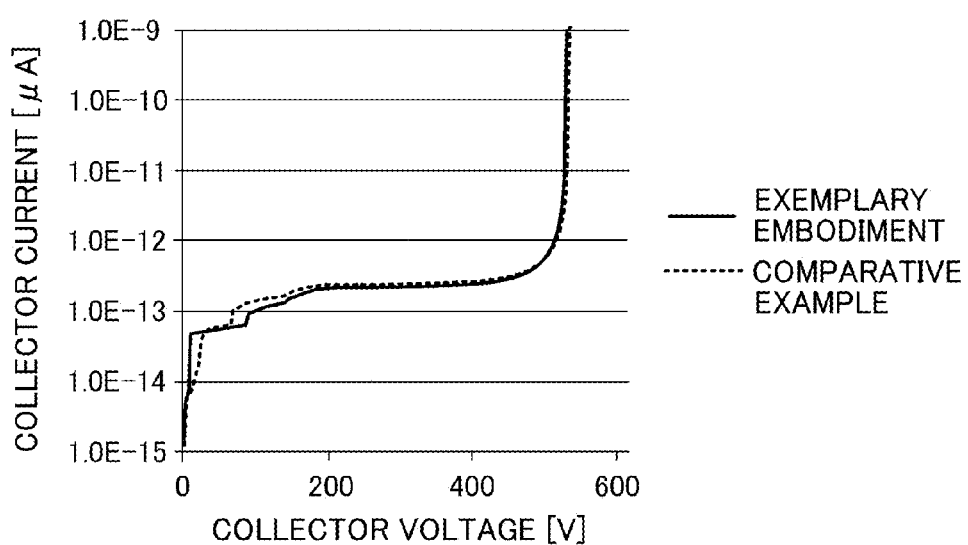
FIG. 3B is a graph illustrating a result of simulating withstand voltage characteristics of a semiconductor device according to the exemplary embodiment of the present invention and a semiconductor device according to the comparative example.

FIG. 3B is a graph illustrating a relationship between collector voltage and collector current, namely, withstand voltage characteristics, in a state in which the gate voltage is a potential of zero. The solid line in FIG. 3B corresponds to the semiconductor device 1 according to the exemplary embodiment of the present invention, and the dotted line corresponds to the semiconductor device 2 according to a comparative example. When the collector current reached 1 nA, the collector voltage (VBces) was 530.5V for the semiconductor device 1 according to the present invention, versus 532V for the semiconductor device 2 according to the comparative example.

As described above, in the semiconductor device 1 according to the exemplary embodiment of the present invention, the collector/emitter saturation voltage Vce(sat) could be reduced by approximately 40% with respect to the semiconductor device 2 according to the comparative example, while maintaining withstand voltage characteristics substantially equal to those of the semiconductor device 2 according to the comparative example. This means that the conductivity loss, which is one of the most important criteria for a power element, can be reduced by 40%. Moreover, the current drive performance of the semiconductor device 1 according to the exemplary embodiment of the present invention could be set to 1.5 or more times that of the semiconductor device 2 according to the comparative example. Thus, the semiconductor device 1 according to the exemplary embodiment of the present invention can greatly improve the tradeoff relationship between the collector/emitter saturation voltage Vce(sat) and the withstand voltage BVces.

Discussion follows regarding the mechanism by which the output characteristics are improved without loss of withstand voltage characteristics in the semiconductor device 1 according to the exemplary embodiment of the present invention.

Figure 4A:
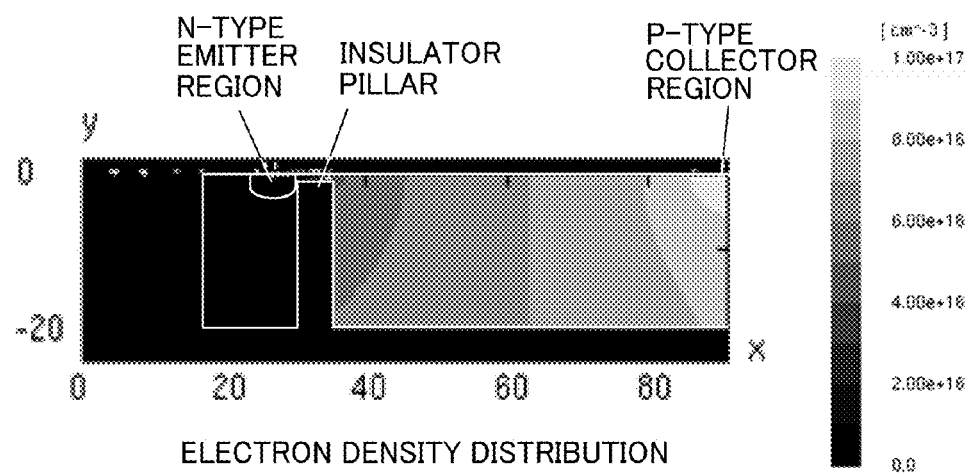
FIG. 4A is a graph illustrating a result of simulating electron density distribution in a semiconductor device according to the exemplary embodiment of the present invention.
Figure 4B:
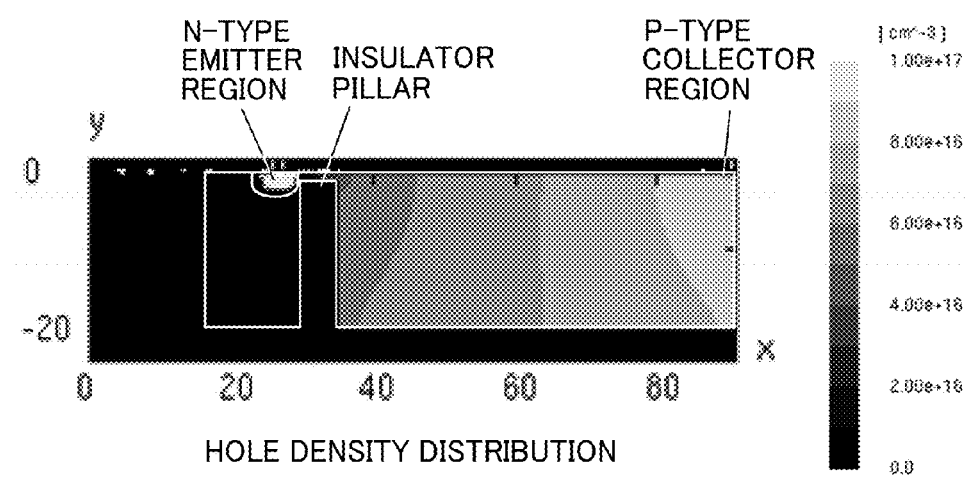
FIG. 4B is a diagram illustrating a result of simulating hole density distribution in a semiconductor device according to the exemplary embodiment of the present invention.
Figure 5A:
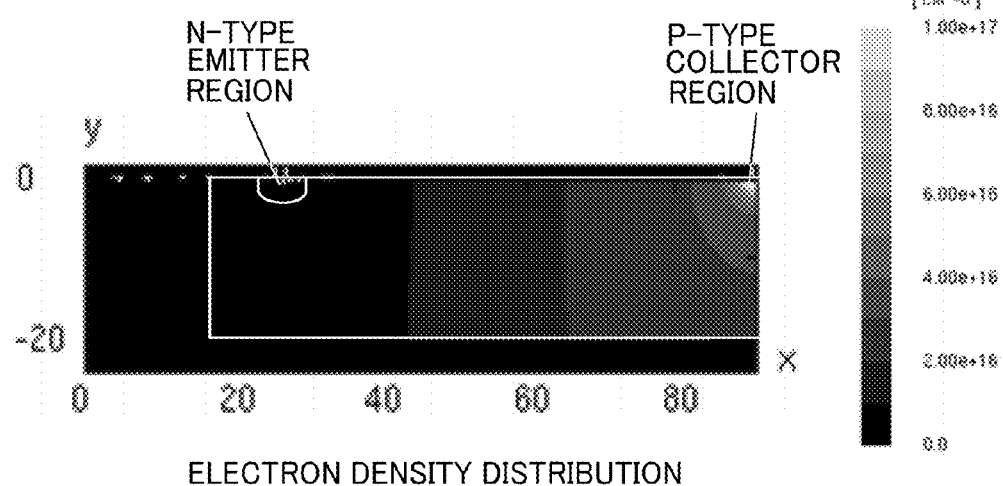
FIG. 5A is a diagram illustrating a result of simulating electron density distribution in a semiconductor device according to the comparative example.
Figure 5B:
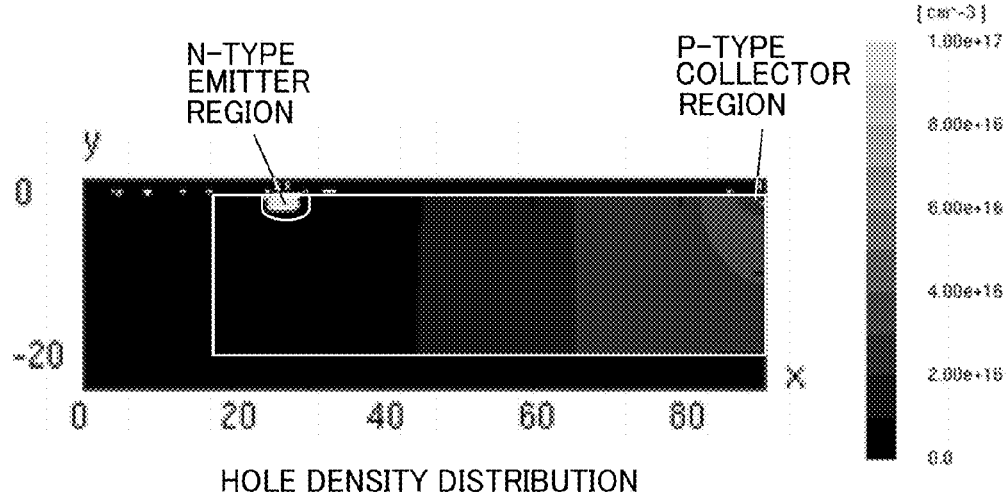
FIG. 5B is a diagram illustrating a result of simulating hole density distribution in a semiconductor device according to the comparative example.

FIG. 4A and FIG. 4B are diagrams illustrating a simulation result for electron density distribution and hole density distribution in the semiconductor device 1 according to the exemplary embodiment of the present invention. FIG. 5A and FIG. 5B are diagrams illustrating a simulation result for electron density distribution and hole density distribution in the semiconductor device 2 according to the comparative example. In both cases, the emitter voltage was 0V, the gate voltage was 15V, and the collector voltage was 2V.

The electronic density and the hole density in the drift region extending between the N-type emitter region 44 and the P-type collector region 45 is higher in the semiconductor device 1 according to the exemplary embodiment of the present invention than in the semiconductor device 2 according to the comparative example. This is hypothesized to be due to an increased carrier density within the N-type semiconductor layer 13 forming the drift region, due to positive feedback from carrier injection that includes the following processes. (1) Holes injected into the N-type semiconductor layer 13 (drift region) from the P-type collector region 45 due to the conductivity modulation effect of the IGBT characteristics are stopped by the insulator pillar 20 and stay in the N-type semiconductor layer 13 (drift region). (2) Excess electrons that are drawn to the holes staying in the N-type semiconductor layer 13 (drift region) are injected into the N-type semiconductor layer 13 (drift region) from the N-type emitter region 44. (3) This causes the holes to be injected further into the N-type semiconductor layer 13 (drift region) from the P-type collector region 45.

It is conceivable that, as illustrated in FIG. 3A, a higher output characteristic is obtained in the semiconductor device 1 according to the exemplary embodiment of the present invention than in the comparative example, due to the electron density and the hole density in the N-type semiconductor layer 13 (drift region) increasing. The withstand voltage BVces is primarily determined by the length and thickness of the drift region, and the concentration of impurities in the drift region. It is conceivable that these parameters do not change due to the presence of the insulator pillar 20, causing similar withstand voltage characteristics to be obtained for the semiconductor device 1 according to the exemplary embodiment of the present invention and for the semiconductor device 2 according to the comparative example.

Explanation follows regarding results of investigating optimum structures for the insulator pillar 20.

Figure 6A:
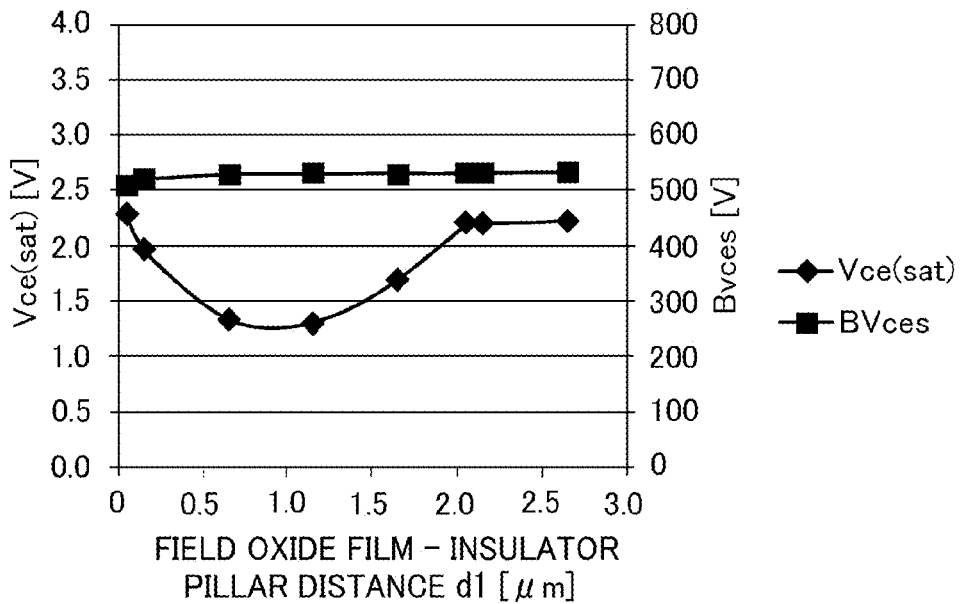
FIG. 6A is a graph illustrating results acquired by simulating changes in collector/emitter saturation voltage and withstand voltage when the distance between an insulator pillar and a field oxide film is changed according to the exemplary embodiment of the present invention.

FIG. 6A is a graph illustrating results acquired by simulating changes in the collector/emitter saturation voltage Vce(sat) and the withstand voltage BVces when the distance d1 between the insulator pillar 20 and the field oxide film 33 is changed. Note that the width w of the insulator pillar 20 in the gate length direction was 5 μm, and the distance d2 between the insulator pillar 20 and the P-type base region was 0.15 μm. The value of the collector/emitter saturation voltage Vce(sat) is the value given when the gate voltage was 15V and 10 μA of collector current flowed. The value of the withstand voltage BVces is the value given when the collector current reached 1 nA. When the distance d1 between the insulator pillar 20 and the field oxide film 33 was set to be from 0.1 μm to 2 μm, the collector/emitter saturation voltage Vce(sat) could be set smaller than the value (2.2V) of the semiconductor device 2 according to the comparative example without causing a drop in the withstand voltage BVces.

Figure 6B:
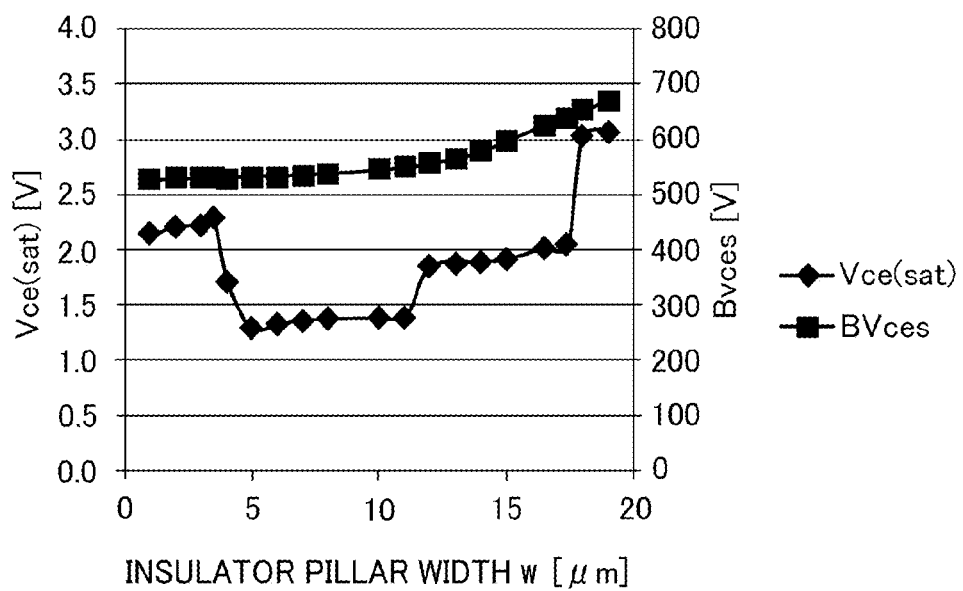
FIG. 6B is a graph illustrating results acquired by simulating changes in collector/emitter saturation voltage and withstand voltage when the width of an insulator pillar according to the exemplary embodiment of the present invention in a gate length direction is changed.

FIG. 6B is a graph illustrating a result acquired by simulating changes to the collector/emitter saturation voltage Vce(sat) and the withstand voltage BVces when the width w of the insulator pillar 20 in the gate length direction is changed. The distance d1 between the insulator pillar 20 and the field oxide film 33 was set to 1.2 μm, and the distance d2 between the insulator pillar 20 and the P-type base region 43 was set to 0.15 μm. The value of the collector/emitter saturation voltage Vce(sat) is the value when the gate voltage was set to 15V and a collector current of 10 μA flowed. The value of the withstand voltage BVces is the value when the collector current reached 1 nA. When the width w of the insulator pillar 20 in the gate length direction was set to be from approximately 4 μm to approximately 17.5 μm (namely, 6.7% to 29.2% of the length of the field oxide film 33 in the gate length direction (60 μm)), the collector/emitter saturation voltage Vce(sat) could be made smaller than the value (2.2V) of the semiconductor device 2 according to the comparative example, without causing the withstand voltage BVces to drop. Moreover, when the width w of the insulator pillar 20 in the gate length direction was from 10 μm to 15 μm (namely, 6.7% to 29.2% of the length of the field oxide film 33 in the gate length direction (60 μm)), the collector/emitter saturation voltage Vce(sat) was smaller than in the semiconductor device 2 according to the comparative example, and the withstand voltage BVces was higher than in the semiconductor device 2 according to the comparative example.

Figure 6C:
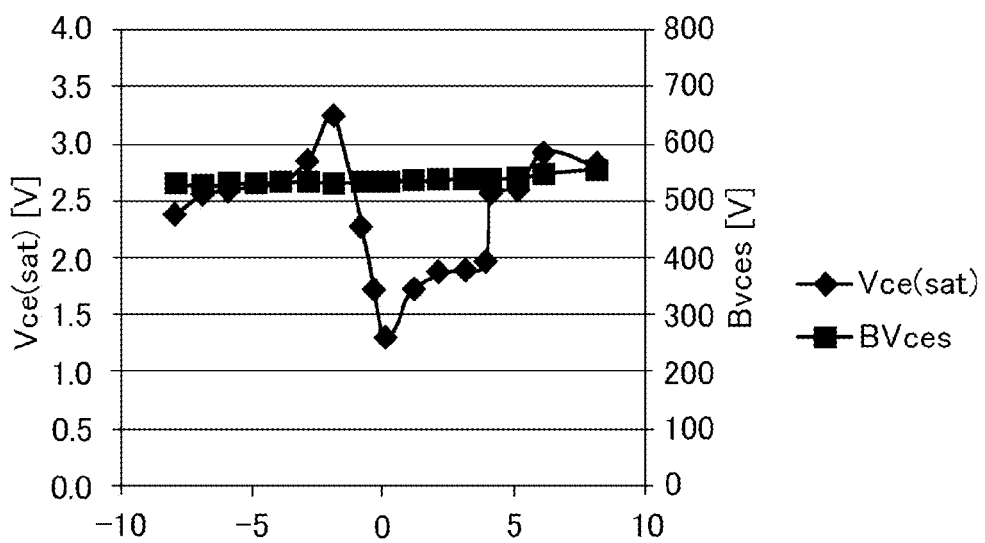
FIG. 6C is a graph illustrating results acquired by simulating changes in collector/emitter saturation voltage and withstand voltage when the distance between an insulator pillar and a P-type base region is changed.

FIG. 6C is a graph illustrating results acquired by simulating changes in the collector/emitter saturation voltage Vce(sat) and the withstand voltage BVces when the distance d2 between the insulator pillar 20 and the P-type base region 43 is changed. The distance d1 between the insulator pillar 20 and the field oxide film 33 was set to 1.2 μm, and the width w of the insulator pillar 20 in the gate length direction was set to 5 μm. The value of the collector/emitter saturation voltage Vce(sat) is the value when the gate voltage was set to 15V and 10 μA of collector current flowed. The value of the withstand voltage BVces is the value when the collector current reached 1 nA. When the distance d2 between the insulator pillar 20 and the P-type base region 43 was set to from approximately −0.5 μm to approximately 4 μm, the collector/emitter saturation voltage Vce(sat) could be made smaller than the value for the semiconductor device 2 according to the comparative example (2.2V) without causing a drop in the withstand voltage BVces. Note that a negative value for the distance d2 between the insulator pillar 20 and the P-type base region 43 means that the insulator pillar 20 intrudes into the P-type base region 43 such that they overlap.

Second Exemplary Embodiment

Figure 7A:
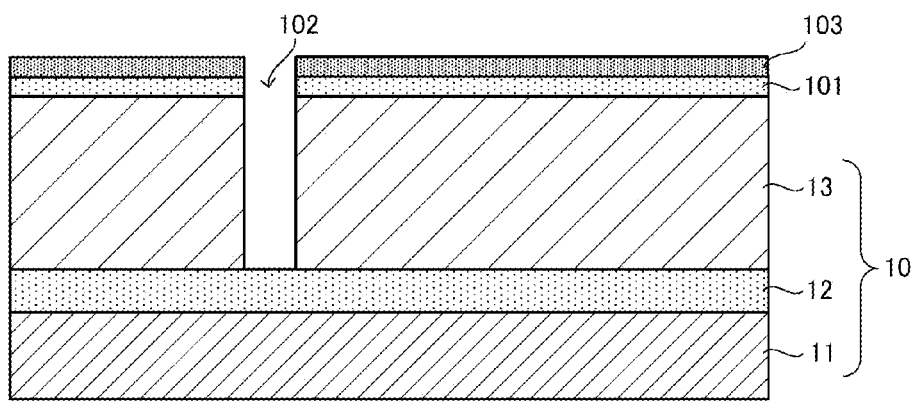
FIG. 7A to 7C are diagrams illustrating a manufacturing method for a semiconductor device according to a second exemplary embodiment of the present invention.
Figure 7B:
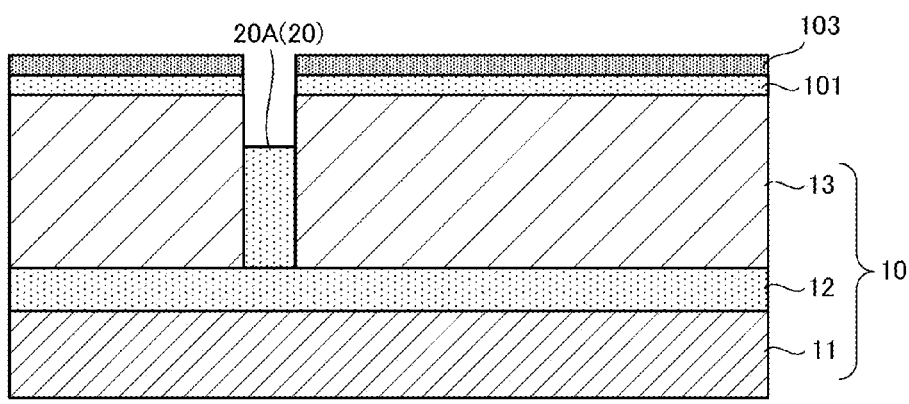
Figure 7C:
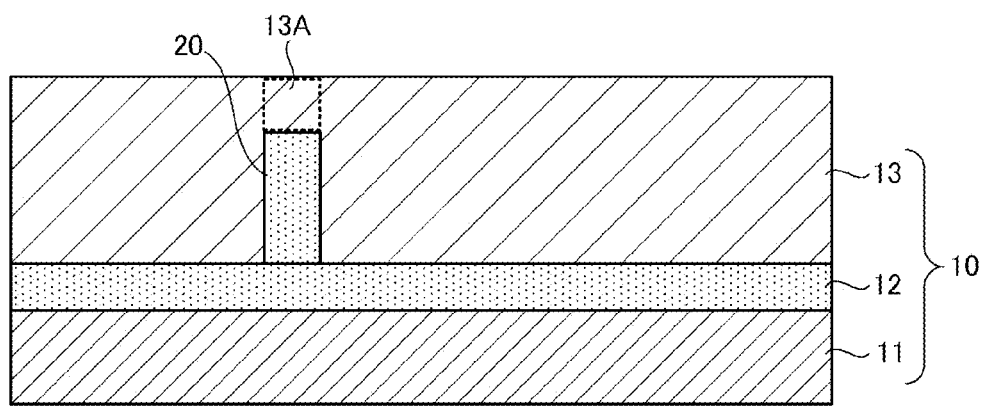

Explanation follows regarding a manufacturing method for a semiconductor device according to a second exemplary embodiment of the present invention. FIG. 7A to FIG. 7C are cross-sections illustrating the manufacturing method for the semiconductor device according to the second exemplary embodiment of the present invention.

First, an SOI substrate 10 that includes a substrate layer 11, an insulating layer 12, and an N-type semiconductor layer 13 is prepared. Next, a silicon oxide film 101 having a thickness of approximately 0.1 μm is formed on the surface of the N-type semiconductor layer 13 using a known thermal oxidation method, and a silicon nitride film 103 having a thickness of approximately 0.1 μm is subsequently formed on the surface of the silicon oxide film 101 using a known CVD method. Next, a trench 102 that reaches down to the insulating layer 12 is formed at a formation position of an insulator pillar 20 using a known photolithographic technique and etching technique (FIG. 7A).

Next, after covering the inner walls of the trench 102 with a silicon oxide film using a known thermal oxidation method, an insulator 20A, such as $SiO_2$, that configures the insulator pillar 20 is embedded into the trench 102 using a known CVD method. Subsequently, insulator deposited on a silicon nitride film 103 is removed, and an approximately 1.5 μm upper portion is also removed from the insulator 20A embedded into the trench 102 using known etching method. The insulator pillar 20 is thereby formed connected to the insulating layer 12 (FIG. 7B).

Next, silicon crystals containing phosphorous at approximately $3 \times 10^{14}$ cm$^{-3}$, this being similar to the concentration of impurities in the N-type semiconductor layer 13, are caused to grow using a known epitaxial method. In an upper portion of the insulator pillar 20, the silicon crystals grow in a lateral direction from an exposed side wall of the trench 102, and the upper portion of the insulator pillar 20 inside the trench 102 is closed off by N-type silicon 13A that contains phosphorous at a concentration similar to the concentration of impurities in the N-type semiconductor layer 13. However, silicon crystals do not grow on the silicon nitride film 103 formed on the surface of the N-type semiconductor layer 13. Next, the silicon oxide film 101 and the silicon nitride film 103 are removed by etching so as to expose the surface of the N-type semiconductor layer 13. Subsequently, planarization processing is performed to match the initial surface of the N-type semiconductor layer 13 using a known chemical mechanical polishing (CMP) method (FIG. 7C).

Subsequent processes are similar to those of the manufacturing method according to the first exemplary embodiment described above, and duplicate explanation is therefore omitted.

In the manufacturing method according to the second exemplary embodiment, in the crystal growth process for burying an upper portion of the insulator pillar 20 inside the trench 102 with the N-type silicon 13A, by forming the silicon nitride film 103 on the surface of the N-type semiconductor layer 13, silicon crystals do not grow on the N-type semiconductor layer 13. This enables controllability to be increased in the subsequent planarization processing.

Modified Example

FIG. 8A to FIG. 8D are diagrams illustrating a variation of the embodiment of the insulator pillar, and illustrate a configuration of the insulator pillar in a plane parallel to the gate length direction and a gate width direction.

As illustrated in FIG. 8A to FIG. 8D, the size of a trench for forming the insulator pillar 20 can be made smaller by dividing the insulator pillar 20 into plural segments 20a. This thereby simplifies burying an insulator inside the trench, and burying an upper portion of the insulator that was buried inside the trench with N-type silicon.

Figure 8A:
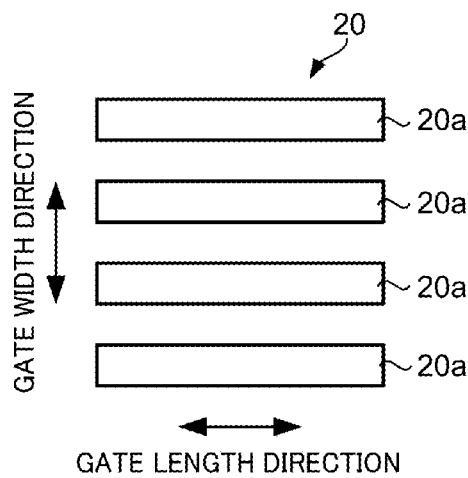
FIG. 8A to 8D are diagrams illustrating a variation of the embodiment of an insulator pillar according to the exemplary embodiment of the present invention.

FIG. 8A is an example of a case in which the insulator pillar 20 is configured by plural segments 20a that are divided in the gate width direction. This configuration is equivalent to alternating IGBTs that include the insulator pillar, and IGBTs that do not include the insulator pillar, connected together in parallel. This configuration also enables output characteristics to be improved while maintaining withstand voltage characteristics.

Figure 8B:
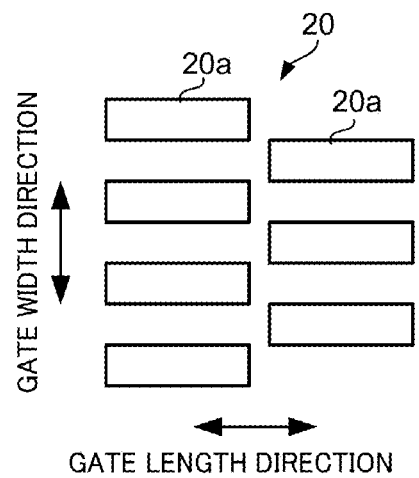

FIG. 8B is an example of a case in which the segments 20a of the insulator pillar 20, which are divided in the gate width direction, are placed side by side in the gate length direction. In the example illustrated in FIG. 8B, the segments 20a disposed in one row, and the segments 20a disposed in another row are disposed at positions that give a gap between the rows. Carriers flowing in the gate length direction can thus be prevented from passing through the gap in the segments 20a by alternating how the segments 20a, which are disposed so as to form plural rows, are disposed, and the effect of increasing the carrier density inside the drift region described above can be maintained. The output characteristics can accordingly be improved while maintaining the withstand voltage characteristics.

Figure 8C:
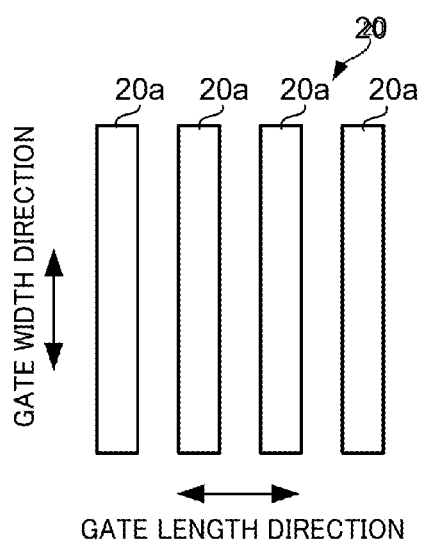
Figure 8D:
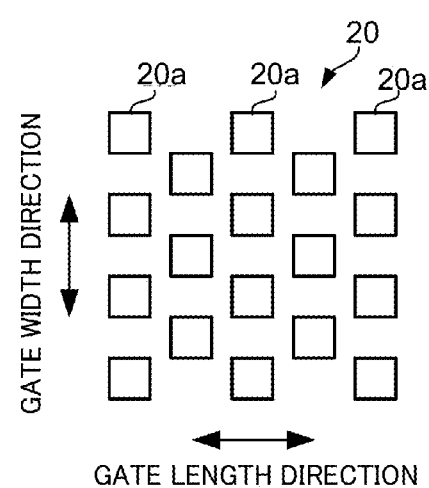

FIG. 8C is an example of a case in which the segments 20a of the insulator pillar 20 are divided in the gate length direction. FIG. 8D is an example of a case in which the segments 20a of the insulator pillar 20 are disposed in a staggered pattern. Even in cases in which the segments 20a of the insulator pillar 20 are disposed in this manner, carriers flowing in the gate length direction can be prevented from passing through the gap between the segments 20a, and the effect of increasing the carrier density inside the drift region described above can be maintained. The output characteristics can according be improved while maintaining the withstand voltage characteristics.

Although explanation has been given regarding cases in which the SOI substrate 10 is employed in each of the exemplary embodiments above, the present invention can be applied even in cases employing semiconductor substrates other than SOI substrates that do not include the insulating layer 12.

Moreover, although examples of cases in which the field oxide film 33 extends across the entire region between the P-type base region 43 and the P-type collector region 45 in the exemplary embodiments above, the field oxide film 33 may extend in a partial region between the P-type base region 43 and the P-type collector region 45, as illustrated in FIG. 9. In such cases, the insulator pillar 20 need not be disposed directly below the field oxide film 33, and the insulator pillar 20 may be provided separated from the surface of the N-type semiconductor layer 13. In other words, the insulator pillar 20 may be provided separated from the surface of the N-type semiconductor layer 13 by a gap.

What is claimed is:

1. A semiconductor device comprising:
   a semiconductor layer having a first surface, the semiconductor layer having a first film thickness in a direction orthogonal to the first surface and a second film thickness in the direction orthogonal to the first surface, wherein the second film thickness is less than the first film thickness;
   a drift region disposed at the semiconductor layer, the drift region having one end which contacts a base region formed at the first surface and another end which contacts a collector region formed at the first surface, the drift region including a slit portion that has the second film thickness;
   an insulator region at an area of the first surface corresponding to the drift region, the insulator region contacting the drift region; and
   a gate electrode at the first surface, the gate electrode contacting the base region via a gate insulating film and contacting the drift region via the insulator region.

2. The semiconductor device according to claim 1, wherein a second surface of the semiconductor layer, which is disposed so as to face the first surface, contacts a substrate layer via an insulating layer.

3. The semiconductor device according to claim 2, wherein the semiconductor layer includes a protrusion portion that protrudes from the second surface toward the first surface at a region corresponding to the slit portion.

4. The semiconductor device according to claim 1, wherein a distance between the slit portion and the base region is smaller than a distance between the slit portion and the collector region.

5. The semiconductor device according to claim 1, wherein the second film thickness is less than a thickness of the base region in the direction orthogonal to the first surface.

6. The semiconductor device according to claim 1, wherein the slit portion is configured to narrow a migration pathway of carriers, the migration pathway being parallel to the first surface and disposed in the direction orthogonal to the first surface.

* * * * *